United States Patent
Lee

(10) Patent No.: US 10,748,964 B2
(45) Date of Patent: Aug. 18, 2020

(54) ELECTRONIC DEVICE AND METHOD FOR FABRICATING THE SAME

(71) Applicant: SK hynix Inc., Icheon (KR)

(72) Inventor: Jae-Yeon Lee, Icheon (KR)

(73) Assignee: SK hynix Inc., Icheon (KR)

(*) Notice: Subject to any disclaimer, the term of this patent is extended or adjusted under 35 U.S.C. 154(b) by 0 days.

(21) Appl. No.: 16/219,394

(22) Filed: Dec. 13, 2018

(65) Prior Publication Data

US 2019/0123106 A1   Apr. 25, 2019

Related U.S. Application Data

(63) Continuation of application No. 15/087,327, filed on Mar. 31, 2016, now Pat. No. 10,192,926.

(30) Foreign Application Priority Data

Oct. 20, 2015  (KR) .................. 10-2015-0145911

(51) Int. Cl.
*H01L 27/24* (2006.01)
*G11C 13/00* (2006.01)
(Continued)

(52) U.S. Cl.
CPC ........ *H01L 27/2463* (2013.01); *G06F 3/0604* (2013.01); *G06F 3/0656* (2013.01); *G06F 3/0679* (2013.01); *G06F 12/0802* (2013.01); *G11C 13/0002* (2013.01); *G11C 13/003* (2013.01); *G11C 13/004* (2013.01); *G11C 13/0069* (2013.01); *H01L 27/224* (2013.01);
(Continued)

(58) Field of Classification Search
CPC . H01L 27/2463; G06F 3/0604; G11C 13/004; G11C 13/0069
USPC .......................................... 365/148
See application file for complete search history.

(56) References Cited

U.S. PATENT DOCUMENTS

| | | | |
|---|---|---|---|
| 2004/0232463 A1 | 11/2004 | Chung et al. | |
| 2006/0038221 A1* | 2/2006 | Lee ..................... | B82Y 10/00 257/315 |

(Continued)

FOREIGN PATENT DOCUMENTS

CN   101506980 A   8/2009

OTHER PUBLICATIONS

Office Action dated Feb. 3, 2020 for Chinese Application 201610487376.9.

(Continued)

*Primary Examiner* — Anthan Tran

(57) ABSTRACT

An electronic device and a method for fabricating the same are provided. An electronic device according to an implementation of the disclosed technology is an electronic device including a semiconductor memory, wherein the semiconductor memory includes: a plurality of first lines extending in a first direction; a plurality of second lines extending in a second direction that intersects with the first direction; a plurality of variable resistance elements disposed between the first lines and the second lines and located at intersections of the first lines and the second lines; and a plug connected to a first portion of each of the first lines, wherein the plug comprises a conductive layer and a material layer having a resistance value higher than that of the conductive layer.

22 Claims, 11 Drawing Sheets

(51) Int. Cl.
    *H01L 27/22*     (2006.01)
    *G06F 3/06*     (2006.01)
    *G06F 12/0802*     (2016.01)
    *H01L 45/00*     (2006.01)

(52) U.S. Cl.
    CPC ........ *H01L 27/2409* (2013.01); *H01L 45/122* (2013.01); *G11C 2013/0045* (2013.01); *G11C 2013/0078* (2013.01); *G11C 2213/15* (2013.01); *G11C 2213/52* (2013.01)

(56) References Cited

U.S. PATENT DOCUMENTS

| | | | |
|---|---|---|---|
| 2007/0281420 A1* | 12/2007 | Lai | H01L 45/04 438/253 |
| 2009/0268505 A1* | 10/2009 | Beer | G11C 11/5614 365/148 |
| 2012/0199805 A1 | 8/2012 | Sorada et al. | |
| 2013/0051117 A1 | 2/2013 | En et al. | |
| 2013/0149815 A1 | 6/2013 | Murase et al. | |
| 2013/0178042 A1 | 7/2013 | Ninomiya et al. | |
| 2013/0200322 A1* | 8/2013 | Somaschini | H01L 45/06 257/4 |
| 2013/0343119 A1* | 12/2013 | Redaelli | G11C 13/004 365/163 |
| 2016/0218286 A1 | 7/2016 | Lin et al. | |
| 2019/0123106 A1 | 4/2019 | Lee | |

OTHER PUBLICATIONS

Office Action dated Jun. 26, 2020 for related U.S. Appl. No. 16/219,401.

\* cited by examiner

ELECTRONIC DEVICE AND METHOD FOR FABRICATING THE SAME

CROSS-REFERENCE TO RELATED APPLICATIONS

The present application is a continuation of and claims priority to Ser. No. 15/087,327 filed Mar. 31, 2016, which claims priority of Korean Patent Application No. 10-2015-0145911, entitled "ELECTRONIC DEVICE AND METHOD FOR FABRICATING THE SAME" and filed on Oct. 20, 2015, which are incorporated herein by reference in their entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device in which the operating characteristics and reliability of a semiconductor memory can be improved.

In an implementation, an electronic device including a semiconductor memory is provided wherein the semiconductor memory includes: a plurality of first lines extending in a first direction; a plurality of second lines extending in a second direction that intersects with the first direction; a plurality of variable resistance elements disposed between the first lines and the second lines and located at intersections of the first lines and the second lines; and a plug connected to a first portion of each of the first lines, wherein the plug comprises a conductive layer and a material layer having a resistance value higher than that of the conductive layer.

Implementations of the above electronic device may include one or more the following.

The material layer comprises a dielectric material or a semiconductor material. The material layer exhibits an ohmic-like behavior at an operating current of the semiconductor memory. The material layer is not broken down at an operating current of the semiconductor memory. The plug is used as a current path in a write operation for storing data in the variable resistance elements. The semiconductor memory further comprises a conductive plug connected to a second portion of each of the first lines, the second portion being separate from the first portion. The plug is used as a current path in a write operation for storing data in the variable resistance elements, and the conductive plug is used as a current path in a read operation for reading data stored in the variable resistance elements. The plug and the conductive plug are disposed in the first direction with the plurality of variable resistance elements disposed therebetween. The plug and the conductive plug are disposed opposite to each other with respect to the variable resistance elements and the second lines disposed between the plug and the conductive plug in the first direction, and have substantially the same thickness in a third direction in which the first lines, the variable resistance elements and the second lines are stacked. A sidewall of the conductive layer is aligned with a sidewall of the material layer. The conductive layer comprises first and second conductive layers, and the material layer is disposed between the first conductive layer and the second conductive layer. The material layer further extends along a sidewall of the second conductive layer. The material layer is located at one or both ends of the plug. The plurality of second lines is divided into first and second groups; the electronic device includes a first mat region including variable resistance elements located at intersections of the plurality of first lines and the second lines of the first group, and a second mat region including variable resistance elements located at intersections of the plurality of first lines and the second lines of the second group; and the plug is located either in a first region between the first mat region and the second mat region or in a second region corresponding to both sides of the first and second mat regions. The semiconductor memory further comprises a conductive plug connected to a second portion of each of the first lines; and the conductive plug is located in one of the first and second regions if the plug is located in the other of the first and second regions.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In an implementation, a method for fabricating an electronic device including a semiconductor memory includes: forming a plug over a substrate, the plug comprising a conductive layer and a material layer having a resistance value higher than that of the conductive layer; forming a first line over the plug, the first line extending in a first direction; forming a variable resistance element over the first line; and forming a second line over the variable resistance element, the second line extending in a second direction intersecting with the first direction.

Implementations of the above method may include one or more the following.

The material layer comprises a dielectric material or a semiconductor material. Forming the plug comprises: forming an interlayer insulating layer over the substrate; etching the interlayer insulating layer to form a hole passing through the interlayer insulating layer; forming the conductive layer that fills a lower portion of the hole; and forming the material layer that fills at least a part of a remaining portion of the hole in which the conductive layer is formed. The material layer fills the part of the remaining portion of the hole, and forming the plug further comprises forming an additional conductive layer that entirely fills the remaining portion of the hole after the material layer is formed. The material layer is formed along sidewalls and a bottom surface of the remaining portion of the hole in which the conductive layer is formed, and sidewalls and a bottom surface of the additional conductive layer are surrounded by the material layer. Forming the plug comprises: forming an interlayer insulating layer over the substrate; etching the interlayer insulating layer to form a hole passing through the interlayer insulating layer; forming the material layer that fills a lower portion of the hole; and forming the conductive layer that fills a remaining portion of the hole. The method further comprising forming, over the substrate, a conductive plug connected to the first line. Forming the plug and the conductive plug comprises: forming an interlayer insulating layer over the substrate; selectively etching the interlayer insulating layer to form a first hole that provides a region in which the plug is to be formed, and a second hole that provides a region in which the conductive plug is to be formed; filling the first and second holes with a conductive material; forming a mask pattern having an opening that exposes the first hole; removing a portion of the conductive material in the first hole; and forming the material layer filling at least a part of a portion of the first hole from which the conductive material is removed. The opening has a width larger than that of the first hole. The method further comprising forming a plurality of first holes arranged in the second direction, wherein a plurality of openings exposing the plurality of first holes each has a line shape that extends in the second direction. The plug and the conductive plug are disposed in the first direction with the variable resistance elements disposed therebetween.

These and other aspects, implementations and associated advantages are described in greater detail in the drawings, the description and the claims.

DETAILED DESCRIPTION

Figure 1A:
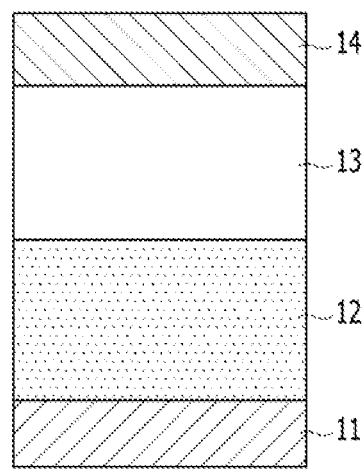
FIG. 1A is a cross-sectional view illustrating a variable resistance element of a first comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Before describing implementations of the disclosed technology, variable resistance elements of comparative examples and methods for operating the variable resistance elements will be described.

Figure 1B:
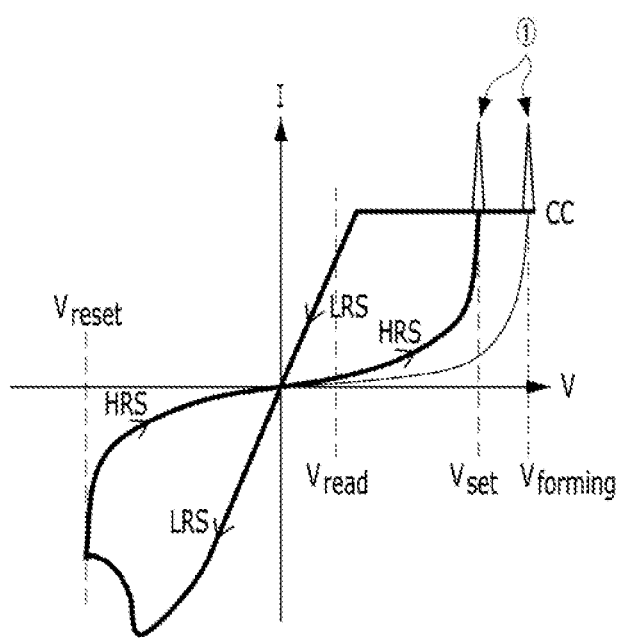
FIG. 1B is a graph explaining a method for operating the variable resistance element illustrated in FIG. 1A.

FIG. 1A is a cross-sectional view illustrating a variable resistance element of a first comparative example, and FIG. 1B is a graph explaining a method for operating the variable resistance element illustrated in FIG. 1A.

Referring to FIG. 1A, the variable resistance element of the first comparative example includes a first electrode 11, a second electrode 14 spaced apart from the first electrode 11, a variable resistance layer 12 disposed between the first electrode 11 and the second electrode 14, and a selection element layer 13 disposed between the variable resistance layer 12 and the second electrode 14.

Herein, the first electrode 11 and the second electrode 14 are located at both ends, e.g., opposite ends, of the variable resistance element, and may supply a voltage or current to the variable resistance element. The first and second electrodes 11 and 14 may be formed of any of various electrically conductive materials such as metals, metal nitrides, and combinations thereof.

The variable resistance layer 12 may have a variable resistance characteristic that switches between different resistance states according to the voltage or current supplied through the first electrode 11 and the second electrode 14. The variable resistance layer 12 may include a single-layer structure or multi-layer structure including any of various materials that are used in RRAM, PRAM, FRAM, MRAM, and the like. The various materials may include metal oxides such as transition metal oxides or perovskite-based materials, phase-change materials such as chalcogenide-based materials, ferroelectric materials, and ferromagnetic materials, and the like. A resistance state of the variable resistance layer 12 can change according to whether a conductive path is created in or removed from the variable resistance layer 12. Specifically, if a conductive path passing through the variable resistance layer 12 is created in the variable resistance layer 12, the variable resistance layer 12 may have a low-resistance state. If the conductive path is removed from the variable resistance layer 12, the variable resistance layer 12 may have a high-resistance state. For example, if the variable resistance layer 12 is formed of a metal oxide containing a large amount of oxygen vacancies, the conductive path may be created or removed by the movement of the oxygen vacancies. However, implementations are not limited thereto, and the conductive path may be formed in various ways depending on the kind, structure or operating characteristics of the variable resistance layer 12.

The selection element layer 13 may be connected to one end of the variable resistance layer 12 so as to control access to the variable resistance layer 12. The selection element layer 13 may have threshold switching characteristics. Thus, the selection element layer 13 may block a current flow to the variable resistance layer 12 when the magnitude of the voltage or current supplied through the first electrode 12 and the second electrode 14 is lower than a certain critical value, and may pass a current when the magnitude of the supplied voltage or current exceeds the certain critical value, and thus the passing current increases rapidly in proportion to the magnitude of the supplied voltage or current. The selection element layer 13 may include a tunneling dielectric layer having a relatively wide bandgap. The tunneling dielectric layer may include a material serving as a diode, an ovonic threshold switching (OST) material such as a chalcogenide-based material, a mixed ionic electronic conducting (MIEC) material such as a metal-containing chalcogenide-based material, or a metal insulator transition material such as $NbO_2$ or $VO_2$, $SiO_2$, $Al_2O_3$ or the like.

In the first comparative example shown in FIG. 1A, the selection element layer 13 is disposed between the variable resistance layer 12 and the second electrode 14, but it may also be disposed between the variable resistance layer 12 and the first electrode 11. Alternatively, the selection element layer 13 may be disposed between the variable resistance layer 12 and the first electrode 11, or the selection element layer 13 may be omitted.

A current-voltage curve of the variable resistance element shown in FIG. 1A is illustrated in FIG. 1B.

Referring to FIG. 1B, the variable resistance element is initially in a high-resistance state (HRS). When a voltage that is applied thereto reaches a voltage having a first polarity, for example, a positive voltage, which has a certain magnitude, a set operation may be performed so that a resistance state of the variable resistance element changes from the high-resistance state (HRS) to a low-resistance state (LRS). The applied voltage causing the set operation will hereinafter be referred to as a "set voltage (Vset)."

The low-resistance state (LRS) of the variable resistance element is maintained even if the level of the applied voltage is reduced. When the applied voltage reaches a voltage having a second polarity, for example, a negative voltage, which has a certain magnitude, a reset operation may be performed so that the resistance state of the variable resistance element changes again to the high-resistance state (HRS). The applied voltage causing the reset operation will hereinafter be referred to as a "reset voltage (Vreset)."

In this way, the variable resistance element can repeatedly switch between the high-resistance state (HRS) and the low-resistance state (LRS). Thus, the variable resistance element can function as a nonvolatile memory cell that stores different data according to the resistance state, and maintains the stored data even when the power applied thereto is removed. In a read operation in which the data stored in the variable resistance element is read out, a read voltage (Vread) between the set voltage (Vset) and the reset voltage (Vreset) can be applied to the variable resistance element. Because the resistance state of the variable resistance element in the read operation has been determined by a previous write operation performed before the read operation, when the read voltage Vread is applied to the variable resistance element, different data may be read out of the variable resistance element depending on the resistance state determined in the previous write operation.

Meanwhile, a set operation initially performed on the variable resistance element can be referred to as a forming operation. A forming voltage (Vforming) used in the forming operation may be higher than the set voltage (Vset). This is because an operation for forming an initial conductive path in the variable resistance layer 12 may require a higher voltage than a voltage to form a conductive path in a subsequent set operation. Each of the set voltage (Vset) and the reset voltage (Vreset), which are used in the set operation and the reset operation, respectively, performed after the forming operation, can be maintained at a substantially constant level.

However, the variable resistance element of the first comparative example described above has a problem in that a high overshooting current occurs in operations, such as the forming operation and/or the set operation, in which the resistance state of the variable resistance element changes from the high-resistance state (HRS) to the low-resistance state (LRS) (see ① in FIG. 1B). The magnitude of the overshooting current may be much greater than a compliance current (CC). This overshooting current can increase the size of a conductive path created in the variable resistance layer 12, resulting in an increase in an off current of the variable resistance element. When the off current of the variable resistance element increases, current leakage through the variable resistance element may increase, and a data read margin may decrease due to a decrease in the difference between an on current and the off current.

Figure 2A:
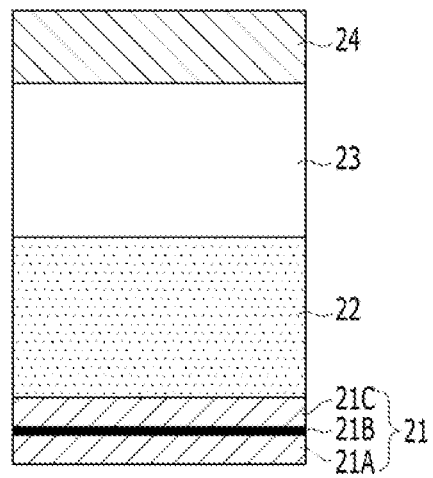
FIG. 2A is a cross-sectional view illustrating a variable resistance element of a second comparative example.
Figure 2B:
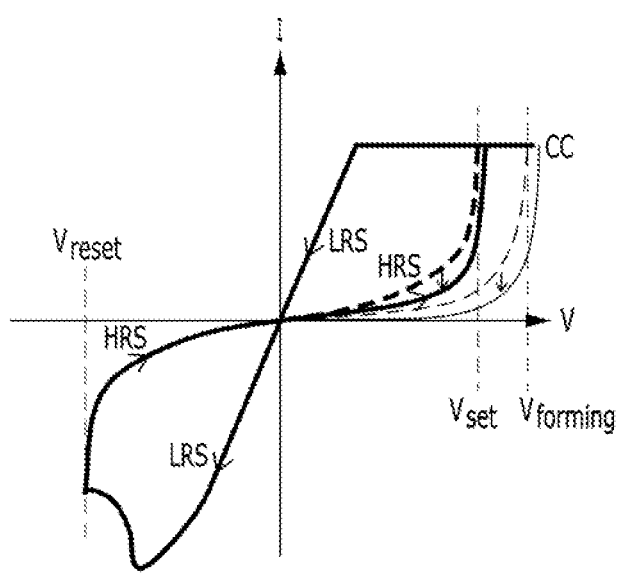
FIG. 2B is a graph explaining a method for operating the variable resistance element illustrated in FIG. 2A.

FIG. 2A is a cross-sectional view illustrating a variable resistance element of a second comparative example, and FIG. 2B is a graph illustrating a method for operating the variable resistance element illustrated in FIG. 2A. The second comparative example is provided to illustrate potential solutions to problems of the first comparative example. In the following description of FIGS. 2A and 2B, a detailed description of parts substantially identical to those of the first comparative example will be omitted.

Referring to FIG. 2A, the variable resistance element of the second comparative example includes a first electrode 21, a second electrode 24 spaced apart from the first electrode 21, a variable resistance layer 22 disposed between the first electrode 21 and the second electrode 24, and a selection element layer 23 sandwiched between the variable resistance layer 22 and the second electrode 24.

Herein, the first electrode 21 may include a first sub-electrode 21A, a second sub-electrode 21C spaced apart from the first sub-electrode 21A, and a material layer 21B sandwiched between the first sub-electrode 21A and the second sub-electrode 21C. The first sub-electrode 21A, the material layer 21B, and the second sub-electrode 21C may be sequentially arranged in the same direction as a direction in which the first electrode 21, the variable resistance layer 22, the selection element layer 23, and the second electrode 24 are sequentially arranged.

The first sub-electrode 21A and the second sub-electrode 21C may be formed of any of various electrically conductive materials including metals, metal nitrides, and combinations thereof.

The material layer 21B may function as a kind of resistance component during an operation of the variable resistance element, and may include a material having a resistance value greater than those of the first sub-electrode 21A and the second sub-electrode 21C. For example, the material layer 21B may include any of various dielectric materials including oxides such as metal oxides or silicon oxides, nitrides such as silicon nitrides, and combinations thereof.

Alternatively, the material layer 21B may include a semiconductor material having a relatively low bandgap. Herein, the material layer 21B may be thin enough that it demonstrates an ohmic-like behavior in which an operating current of the variable resistance element increases as a voltage applied thereto increases. This is because the resistance value of the material layer 21B decreases regardless of the kind of material as the material layer 21B becomes thinner and thus the material layer 21B has leaky characteristics. If the thickness of the material layer 21B is greater than a certain critical value, the material layer 21B will be broken down at the operating current, and thus will have conductive characteristics. In other words, the material layer 21B can no longer function as a resistance component. Herein, the material layer 21B may be sufficiently thin that imposes a burden on etching. Also, the thickness of the material layer 21B may be smaller than the thickness of the first sub-electrode 21A and/or the thickness of the second sub-electrode 21C.

In the second comparative example, the first electrode 21 has a stack structure of the first sub-electrode 21A, the material layer 21B and the second sub-electrode 21C. However, in another example, instead of the first electrode 21, the second electrode 24 may have a stack structure of sub-electrodes and a dielectric layer or a stack structure of a semiconductor layer and sub-electrodes. Alternatively, both the first and second electrodes 21 and 24 may have a stack structure of sub-electrodes and a dielectric layer or a stack structure of a semiconductor layer and sub-electrodes.

A current-voltage curve of the variable resistance element shown in FIG. 2A is illustrated in FIG. 2B.

Referring to FIG. 2B, the current-voltage curve of the second comparative example looks similar to the current-voltage curve of FIG. 1B that is indicated by dotted lines in FIG. 2B. However, the curve of the second comparative example is somewhat shifted downwards in a voltage region between 0 V and the set voltage (Vset) and/or in a voltage region between 0 V and the forming voltage (Vforming), as shown in FIG. 2B. This indicates that a current flowing in a high-resistance state (HRS) of the variable resistance element of the second comparative example, that is, an off-current, decreases compared to that of the first comparative example.

The off-current in the variable resistance element of the second comparative example decreases as described above because an overshooting current in operations such as a forming operation or a set operation, in which a resistance state changes to a low-resistance state (LRS), greatly decreases. That is, the overshooting current is limited to a level similar to that of a compliance current (CC). The overshooting current is reduced because parasitic capacitance at both ends of the variable resistance element is decreased by a thin dielectric layer or semiconductor layer that is a kind of resistance component, which is inserted in the first electrode 21. The decrease in the overshooting current can reduce the size of a conductive path formed in the variable resistance layer 22, resulting in a decrease in the off current of the variable resistance element. As a result, a current leakage through the variable resistance element can be decreased and thus a data read margin of the variable resistance element can be increased, thereby improving operating characteristics of the variable resistance element. Because the decrease in the overshooting current also reduces physical defects in the variable resistance layer 22, the reliability of the variable resistance element, such as the endurance and retention characteristics, can also be improved.

However, in the variable resistance element of the second comparative example, a process for patterning the variable resistance element may increase the complexity of the manufacturing process compared to the first comparative example, because the material layer 21B is included in the variable resistance element.

Additionally, in a write operation for storing data in the variable resistance element, the material layer 21B is preferably used in order to improve the characteristics of the variable resistance element, but is preferably not used in a read operation for reading data stored in the variable resistance element. This is because the material layer 21B can interfere with a current flow, particularly, the current flow in the variable resistance element in the low-resistance state (LRS). As a result, a data read margin of the variable resistance element may be reduced. However, in the case of the second comparative example, the material layer 21B cannot be selectively used according to whether the write operation or the read operation is performed, because the material layer 21B is included in the variable resistance element.

Implementations of the disclosed technology are directed to a semiconductor device and a method for fabricating the same in which characteristics of a variable resistance element can be improved and a process of patterning the variable resistance element can be easily performed. Furthermore, implementations of the disclosed technology are directed to a semiconductor device and a method for fabricating the same in which a resistance component can be selectively used according to whether a write operation or a read operation is performed.

Figure 3A:
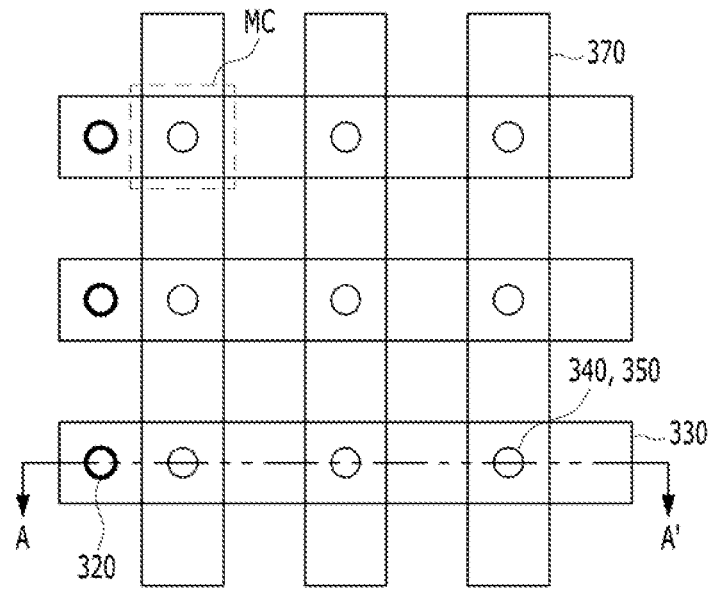
FIG. 3A is a top plan view illustrating a semiconductor device according to an implementation of the disclosed technology.
Figure 3B:
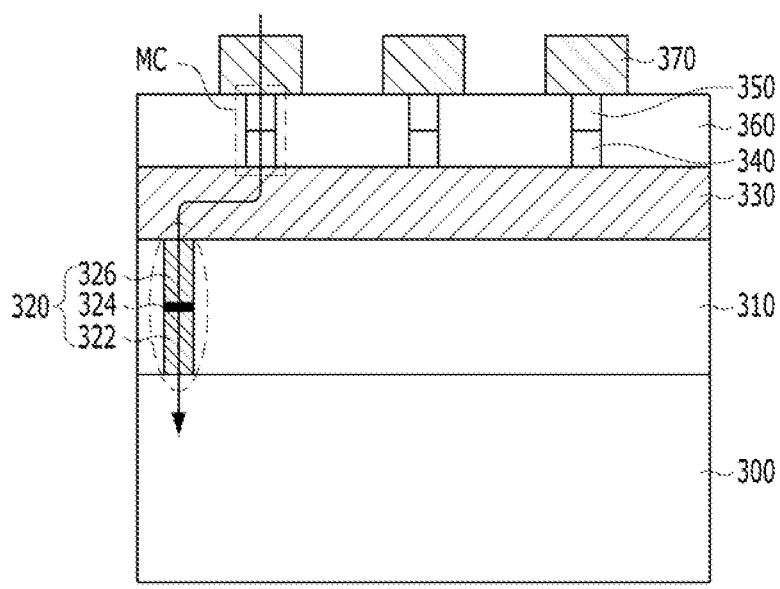
FIG. 3B is a cross-sectional view taken along a line A-A' of FIG. 3A.

FIG. 3A is a top plan view illustrating a semiconductor device according to an implementation of the disclosed technology, and FIG. 3B is a cross-sectional view taken along a line A-A' of FIG. 3A.

Referring to FIGS. 3A and 3B, the semiconductor device according to this implementation may include a substrate 300, a plurality of first lines 330 formed over the substrate 300 and extending in a first direction, a plurality of second lines 370 formed above the first lines 330 and extending in a second direction intersecting with the first direction, a plurality of stack structures, each of which includes a variable resistance layer 340 and a selection element layer 350, which are sandwiched between the first lines 330 and the second lines 370 and formed at intersections of the first lines 330 and the second lines 370, and a plurality of plugs 320 sandwiched between the substrate 300 and the first lines 330 so as to connect the first lines 330 to the substrate 300.

Herein, the first lines 330 and the second lines 370 apply a voltage or current to the plurality of stack structures each including the variable resistance layer 340 and the selection element layer 350. The first lines 330 and the second lines 370 may be formed of any of various electrically conductive materials including metals, metal nitrides, and combinations thereof.

A stack structure of the variable resistance layer 340 and the selection element layer 350, which is sandwiched between a single first line 330 and a single second line 370, may form a unit memory cell (MC). In other words, a memory cell (MC) may be provided at each of intersections of the first lines 330 and the second lines 370.

The variable resistance layer 340 in the memory cell (MC) may be formed of substantially the same material as that of the variable resistance layer 12 shown in FIG. 1. In addition, the selection element layer 350 in the memory cell (MC) may be formed of substantially the same material as that of the selection element layer 13 shown in FIG. 1.

In this implementation, the selection element layer 350 is sandwiched between the variable resistance layer 340 and a corresponding one of the second lines 370. However, implementations are not limited thereto. In another implementation, the selection element layer 350 may also be sandwiched between the variable resistance layer 340 and a corresponding one of the first lines 330. In still other implementations, the selection element layer 350 is sandwiched between the variable resistance layer 340 and a corresponding one of the first lines 330, or the selection element layer 350 is omitted.

In this implementation, the first lines 330 and the second lines 370 may serve as electrodes. However, in another implementation, electrode(s) may further be provided between each of the first lines 330 and the variable resistance layer 340 and/or between the selection element layer 350 and each of the second lines 370.

The plurality of plugs 320 may be connected to bottom surfaces of the first lines 330, respectively, so as to supply a voltage or current to the first lines 330. The plugs 320 may be located outside regions in which memory cells (MC) are arranged in the first and second directions. In the implementation shown in FIGS. 3A and 3B, the plugs 320 may overlap with one end of each of the first lines 330 in the first direction, respectively. Each of the plugs 320 may include a first conductive layer 322, a second conductive layer 326 located above the first conductive layer 322, and a material layer 324 sandwiched between the first conductive layer 322 and the second conductive layer 326. The material layer 324 has a resistance value greater than those of the first and second conductive layers 322 and 326.

Each of the first and second conductive layers 322 and 326 may be formed of any of various electrically conductive materials including metals, metal nitrides, and combinations thereof.

The material layer 324 may be formed of substantially the same material as that of the material layer 21B shown in FIG. 2A, and may function as a kind of resistance component during an operation of the semiconductor device. The material layer 324 may include any of various dielectric materials including oxides such as metal oxides or silicon oxides, nitrides such as silicon nitrides, and combinations thereof. In another implementation, the material layer 324 may include a semiconductor material having a relatively low bandgap. The material layer 324 may be sufficiently thin that it demonstrates an ohmic-like behavior and cannot be broken down during the operation of the semiconductor device. In an implementation, the material layer 324 may be thinner than each of the first and second conductive layers 322 and 326. Because the material layer 324 is patterned together with the first and second conductive layers 322 and 326, it may have a sidewall that is aligned with a sidewall of at least one of the first and second conductive layers 322 and 326.

In the semiconductor device illustrated in FIGS. 3A and 3B, in a write operation for storing data in a selected memory cell (MC) and/or a read operation for reading data stored in the selected memory cell (MC), a current flow (see, e.g., the arrow in FIG. 3B) can be formed to pass through the second line 370 connected with the selected memory cell (MC), the selected memory cell (MC), the first line 330 connected with the selected memory cell (MC), and the plug 320 connected to the first line 330. The plug 320 may be connected to a driving circuit (not shown) for the write operation and/or the read operation. The driving circuit may be provided in the substrate 300 below the plug 320.

Because the current flow passing through the plug 320 including the material layer 324, which is a resistance component, is formed during the write operation and/or read operation of the selected memory cell (MC), substantially the same effects as those of the second comparative example described above may be obtained. In other words, an off current of the memory cell (MC) can be reduced, and thus current leakage can be reduced and a data read margin can be improved. Furthermore, the reliability of an operation of the memory cell (MC) can be ensured.

A method for fabricating the above-described semiconductor device illustrated in FIGS. 3A and 3B will be briefly described hereinafter.

First, a first interlayer insulating layer 310 may be formed on the substrate 300, and then the first interlayer insulating layer 310 may be selectively etched to form holes that provide regions in which the plugs 320 are to be formed.

Following this, an electrically conductive material may be deposited on a resulting structure including the holes formed in the first interlayer insulating layer 310. Then the electrically conductive material may be etched back until it has a desired thickness, thereby forming the first conductive layer 322 filling a lower portion of each of the holes. Next, a dielectric material or a semiconductor material may be deposited on a resulting structure including the first conductive layer 322. The deposited dielectric material or the semiconductor material may be etched back until a desired thickness is obtained, thereby forming the material layer 324 filling a middle portion of each of the holes.

Thereafter, on a resulting structure including the material layer 324, an electrically conductive material may be deposited to fully fill the remaining portion of each of the holes. After that, a planarization process, for example, a chemical mechanical polishing (CMP) process, may be performed on the deposited electrically conductive material until a top surface of the first interlayer insulating layer 310 is exposed, thereby forming the second conductive layer 326 filling an upper portion of each of the holes.

In this way, the pillar-shaped plug 320 is formed. The pillar-shaped plug 320 includes a stack structure of the first conductive layer 322, the material layer 324, and the second conductive layer 326. and the plug 320 is connected to a portion of the substrate 300 and passes through the first interlayer insulating layer 310. In an implementation, the process for forming the first conductive layer 322 or the process for forming the second conductive layer 326 may be omitted.

Next, an electrically conductive material may be deposited on the first interlayer insulating layer 310 and the plugs 320. The deposited electrically conductive material may be selectively etched, thereby forming the first lines 330 that contact top surfaces of the plugs 320 and extend in a first direction. After that, spaces between the first lines 330 may be filled with a dielectric material (not shown).

Next, a variable resistance material and a selection element material may be sequentially deposited on the first lines 330 and the dielectric material. The deposited variable resistance material and the selection element material may be selectively etched, thereby forming the stack structures of the variable resistance layer 340 and the selection element layer 350. Bottom surfaces of the stack structures of the variable resistance layer 340 and the selection element layer 350 may be connected to the first lines 330.

Next, spaces between the stack structures of the variable resistance layer 340 and the selection element layer 350 may be filled with a dielectric material to form a second interlayer insulating layer 360.

Then, an electrically conductive material may be deposited on the stack structures of the variable resistance layer 340 and the selection element layer 350 and on the second interlayer insulating layer 360. The deposited electrically conductive material may be selectively etched, thereby forming the second lines 370 that contact top surfaces of the stack structures of the variable resistance layer 340 and the selection element layer 350 and extend in a second direction crossing the first direction.

In the fabrication method described above with reference to FIGS. 3A and 3B, unlike in the second comparative example, the material layer 324 that is a resistance component is patterned in a process that is separate from a process for forming a memory cell (MC). Thus, the process for forming the memory cell (MC) can be simplified.

Meanwhile, in this implementation, the plugs 320 can be used as current flow paths not only in a write operation, but also in a read operation. However, as described above, a resistance component is preferably not used in the read operation to prevent an on-current of a memory cell (MC) from decreasing in the read operation, thereby increasing a data read margin. This will be described in detail with reference to FIGS. 4A and 4B.

Figure 4A:
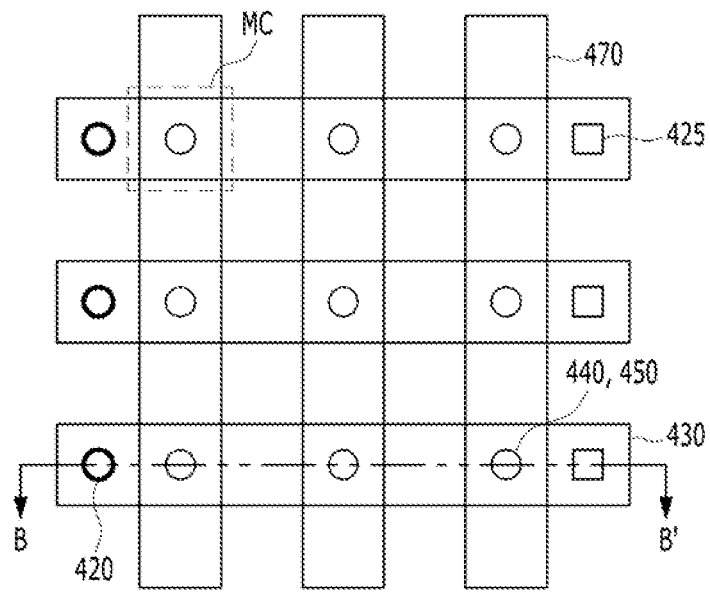
FIG. 4A is a top plan view illustrating a semiconductor device according to another implementation of the disclosed technology.
Figure 4B:
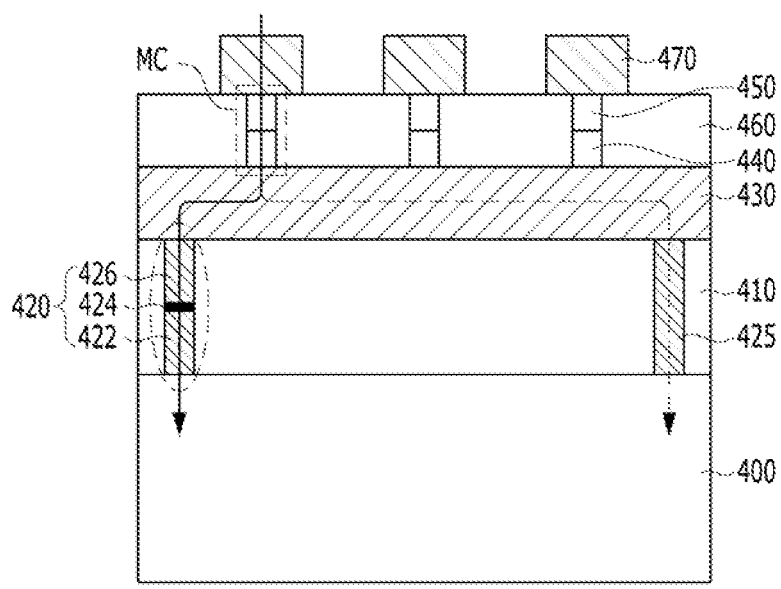
FIG. 4B is a cross-sectional view taken along a line B-B' of FIG. 4A.
Figure 4C:
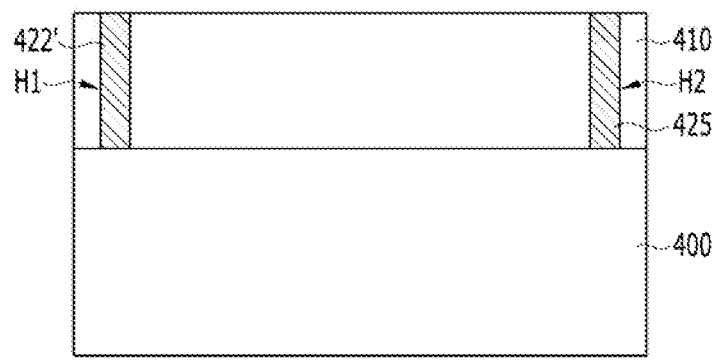
FIGS. 4C to 4D are cross-sectional views showing a method for fabricating the semiconductor device illustrated in FIGS. 4A and 4B.
Figure 4D:
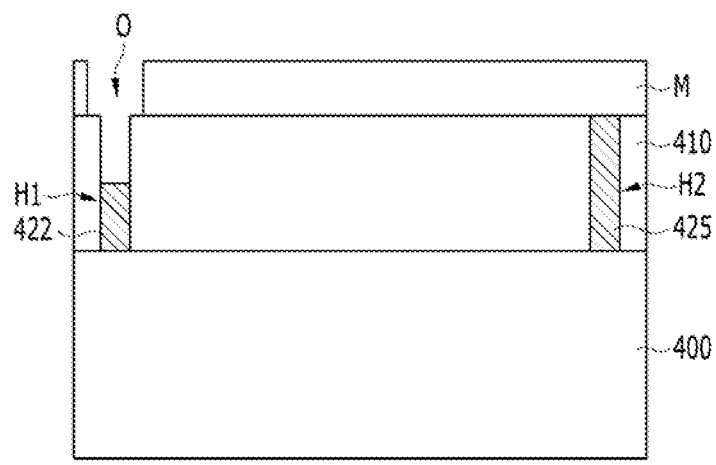

FIG. 4A is a top plan view illustrating a semiconductor device according to another implementation of the disclosed technology. FIG. 4B is a cross-sectional view taken along a line B-B' of FIG. 4A. FIGS. 4C and 4D are cross-sectional views showing a method for fabricating the semiconductor device illustrated in FIGS. 4A and 4B. The following description will focus on differences between the implementation shown in FIGS. 4A and 4B and the implementation shown in FIGS. 3A and 3B.

Referring to FIGS. 4A and 4B, the semiconductor device may include a substrate 400, a plurality of first lines 430 formed over the substrate 400 and extending in a first direction, a plurality of second lines 470 formed above the first lines 430 and extending in a second direction intersecting with the first direction, stack structures, each of which includes a variable resistance layer 440 and a selection element layer 450, which are sandwiched between the first lines 430 and the second lines 470 and formed at intersections of the first lines 430 and the second lines 470, first plugs 420 sandwiched between the substrate 400 and the first lines 430 and connecting first portions of the substrate 400 to the first lines 430, respectively, and second plugs 425 sandwiched between the substrate 400 and the first lines 430 and connecting second portions of the substrate 400 to the first lines 430, respectively.

Similar to the plugs 320 shown in FIGS. 3A and 3B, the first plugs 420 may include a first conductive layer 422, a second conductive layer 426 located above the first conductive layer 422, and a material layer 424 sandwiched between the first conductive layer 422 and the second conductive layer 426. The material layer 424 has a resistance value higher than that of each of the first and second conductive layers 422 and 426. Meanwhile, the second plugs 425 may include an electrically conductive material only without a resistance component.

The first and second plugs 420 and 425 may be located outside regions in which memory cells (MC) are arranged in the first and second directions. In an implementation, the first and second plugs 420 and 425 may be located opposite to each other in the first direction. In other words, a first plug 420 may be connected to one end of a first line 430, and a second plug 425 may be connected to the other end of the first line 430.

In this semiconductor device, in a write operation for storing data in a selected memory cell (MC), a current flow (see, e.g., the solid arrow in FIG. 4B) can be formed to pass through a selected second line 470 connected to the selected memory cell (MC), the selected memory cell (MC), a selected first line 430 connected to the selected memory cell (MC), and a selected first plug 420 connected to the selected first line 430. For this purpose, the first plug 420 may be connected to a driving circuit (not shown) that is provided in the substrate 400 below the first plug 420 and performs the write operation.

On the other hand, in a read operation for reading data stored in the selected memory cell (MC), a current flow (see, e.g., the dotted arrow in FIG. 4B) can be formed to pass through the selected second line 470, the selected memory cell (MC), the selected first line 430, and a selected second plug 425 connected to the selected first line 430. For this purpose, the second plug 425 may be connected to a driving circuit (not shown) that is provided in the substrate 400 below the second plug 425 and performs the read operation.

According to this implementation, the current flow in the write operation can be separated from the current flow in the read operation. In other words, in the write operation, a current flow passing through the material layer 424 that is a resistance component can be produced, whereas in the read operation, a current flow passing through only an electrically conductive material that is included in the second plug 425 can be produced. Thus, a data read margin of the semiconductor device shown in FIGS. 4A and 4B can be improved compared to that of the semiconductor device shown in FIGS. 3A and 3B.

A method for fabricating the semiconductor device described above will be described with reference to FIGS. 4C and 4D.

Referring to FIG. 4C, a first interlayer insulating layer 410 is formed on the substrate 400. The first interlayer insulating layer 410 may be selectively etched to form first holes H1 that provide regions in which the first plugs 420 are to be formed, and second holes H2 that provide regions in which the second plugs 425 are to be formed.

Then, on a resulting structure including the first and second holes H1 and H2, an electrically conductive material may be deposited to sufficiently fill the first and second holes H1 and H2. After that, a planarization process may be performed on the deposited electrically conductive material until a top surface of the first interlayer insulating layer 410 is exposed. Thus, an initial conductive layer 422' is formed in the first holes H1, and the second plugs 425 are formed in the second holes H2.

Next, as shown in FIG. 4D, a mask pattern M having openings O may be formed. The openings O expose regions corresponding to the first holes H1. After that, a portion of the initial first conductive layer 422' exposed by each of the openings O may be etched back to form the first conductive layer 422 filling a lower portion of each of the first holes H1.

Herein, a horizontal width of the openings O may be greater than a horizontal width of the first holes H1 in order to ensure an overlap margin. Subsequent processes are substantially the same as described above with reference to FIGS. 3A and 3B, and thus the detailed description thereof will be omitted.

In an implementation, the mask pattern M may be removed before a process for forming the first lines 430. The mask pattern M may be naturally removed in a process for forming the material layer 424 and/or the process for forming the second conductive layer 426, or may be removed by a separate removal process such as a photoresist strip process.

Meanwhile, as long as the plugs 320 and the first plugs 420 in the above-described implementations include an electrically conductive material and a resistance component having a resistance value higher than that of the electrically conductive material, configurations of the electrically conductive material and the resistance component may be modified in various ways. Examples of this will be described with reference to FIGS. 5 and 6.

Figure 5:
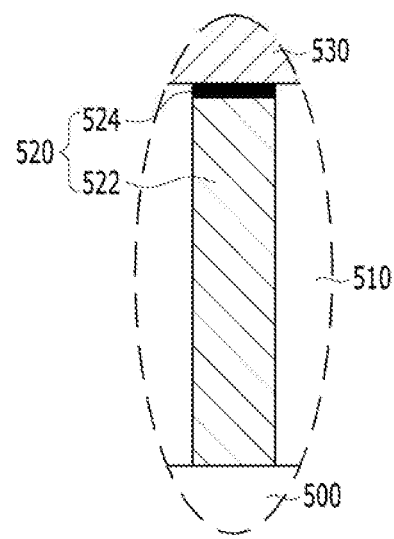
FIG. 5 is a cross-sectional view showing a plug including a resistance element according to an implementation.

FIG. 5 is a cross-sectional view showing a plug including a resistance component according to an implementation.

Referring to FIG. 5, a plug 520 sandwiched between a substrate 500 and a first line 530 may include a conductive layer 522 and a material layer 524. The material layer 524 is located on the conductive layer 522 and has a resistance value higher than that of the conductive layer 522.

In this implementation, the material layer 524 is located at an upper end of the plug 520. In another implementation, the material layer 524 may be located at a lower end or at both ends of the plug 520. In other words, the material layer 524 may be located at an interface between the first line 530 and the conductive layer 522. Alternatively, although not shown in the figures, the material layer 524 may be located at an interface between the substrate 500 and the conductive layer 522.

Figure 6:
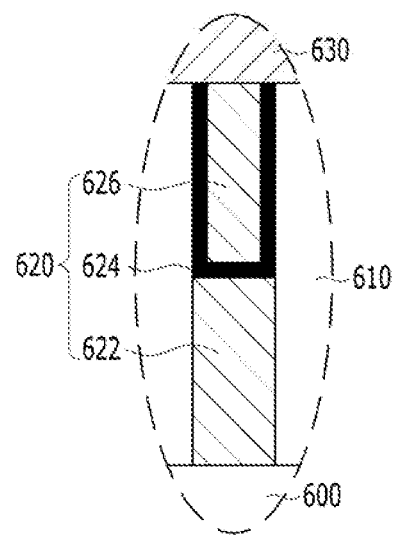
FIG. 6 is a cross-sectional view showing a plug including a resistance element according to another implementation.

FIG. 6 is a cross-sectional view showing a plug including a resistance component according to another implementation.

Referring to FIG. 6, a plug 620 sandwiched between a substrate 600 and a first line 630 may include a first conductive layer 622, a material layer 624 that is a resistance component, and a second conductive layer 626.

Herein, the first conductive layer 622 may have a pillar shape. The second conductive layer 626 may have a pillar shape having a horizontal width smaller than that of the first conductive layer 622. The material layer 624 may be formed on the first conductive layer 622 and surround sidewalls and a bottom surface of the second conductive layer 626. Thus, in an implementation, the material layer 624 may have an outer sidewall aligned with a sidewall of the first conductive layer 622 while it separates the first conductive layer 622 from the second conductive layer 626.

A process for forming the plug 620 described above will be briefly described.

First, a first interlayer insulating layer 610 formed on the substrate 600 may be selectively etched to form a hole, and then the first conductive layer 622 may be formed to fill a lower portion of the hole.

Next, on a resulting structure including the first conductive layer 622, a dielectric material or a semiconductor material may be deposited along sidewalls and a bottom surface of an upper portion of the hole. After that, an electrically conductive material may be deposited on the dielectric material or the semiconductor material to fill the remaining part of the upper portion of the hole.

Thereafter, a planarization process may be performed on the deposited electrically conductive material until a top surface of the first interlayer insulating layer 610 is exposed. As a result, the material layer 624 is formed along the sidewalls and bottom surface of the upper portion of the hole, which includes the first conductive layer 622 in its lower portion, and the second conductive layer 626 is formed to fill the remaining part of the upper portion of the hole and has the sidewalls and bottom surface surrounded by the material layer 624.

Figure 7:
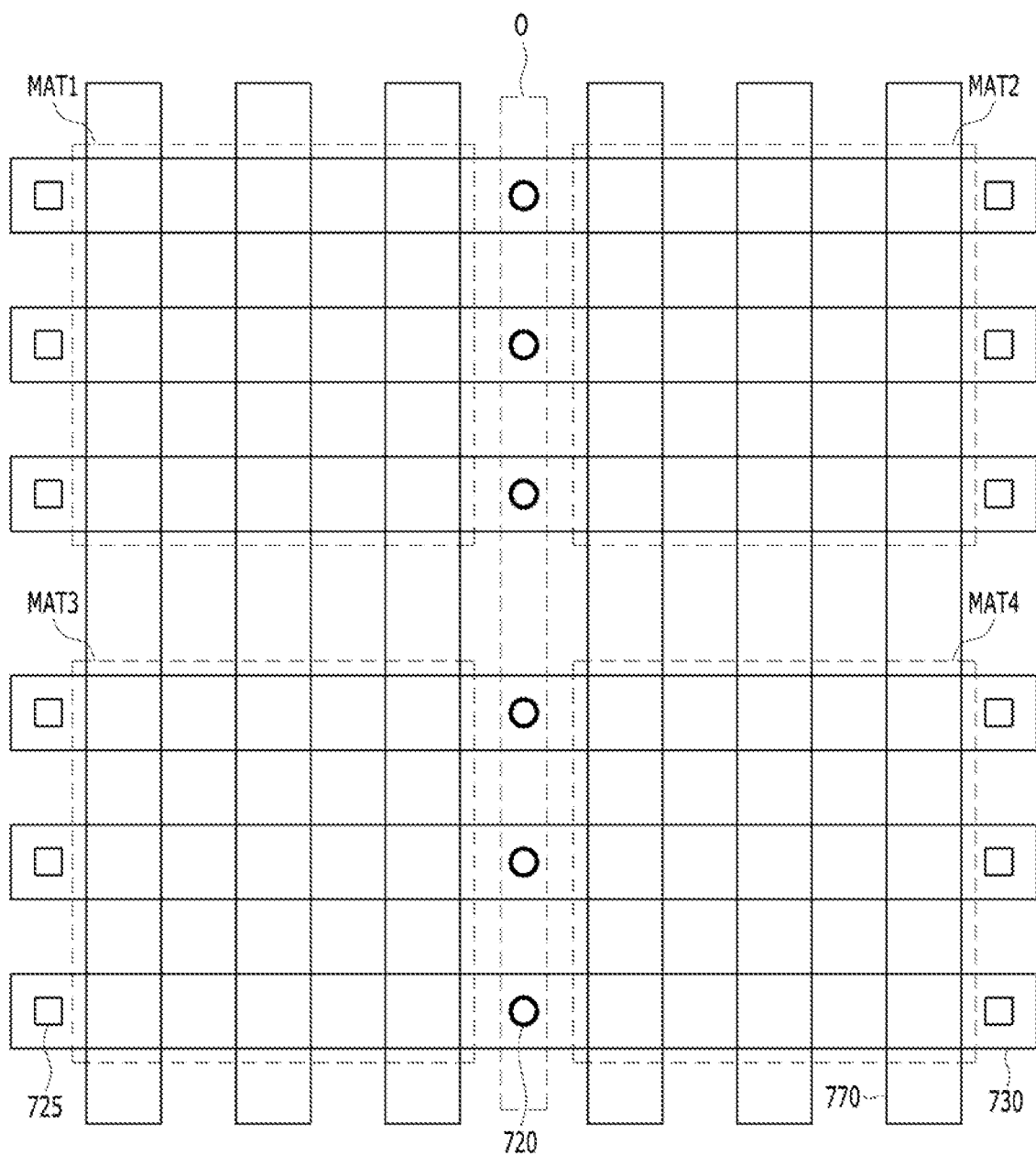
FIG. 7 is a top plan view illustrating a semiconductor device according to another implementation of the disclosed technology.

FIG. 7 is a top plan view illustrating a semiconductor device according to another implementation of the disclosed technology. The semiconductor device includes a plurality of mat regions.

Referring to FIG. 7, the semiconductor device may include a plurality of first lines 730 formed on a substrate (not shown) and extending in a first direction, a plurality of second lines 770 formed above the first lines 730 and extending in a second direction intersecting with the first direction, memory cells disposed between the first lines 730 and the second lines 770 and formed at intersections of the first lines 730 and the second lines 770, and first and second plugs 720 and 725 disposed between the substrate and the first lines 730 and connecting the first lines 730 to the substrate.

Herein, the plurality of first lines 730 can be divided into two or more groups in the second direction, and the plurality of second lines 770 can be divided into two or more groups in the first direction. A region in which memory cells are located at respective intersections of a first group of first lines 730, which belong to a single group, and a second group of second lines 770, which are included in another single group, can be referred to as a "mat region." In the implementation shown in FIG. 7, the semiconductor device includes six first lines 730 divided into two groups, each including three first lines, and six second lines 770 divided into two groups, each including three second lines. Thus, the semiconductor device includes four mat regions, that is, first to fourth mat regions (MAT1, MAT2, MAT3, and MAT4). Each of the first to fourth mat regions (MAT1, MAT2, MAT3, and MAT4) may include 3×3 memory cells disposed at intersections of three first lines 730 and three second lines 770.

The first plugs 720, each including a resistance component, may be located between two adjacent mat regions arranged in the first direction. For example, the first plugs 720 may be disposed between the first mat region (MAT1) and the second mat region (MAT2) and between the third mat region (MAT3) and the fourth mat region (MAT4). The second plugs 725, which do not include a resistance component, may be located on both sides of the two adjacent mat regions arranged in the first direction. For example, the second plugs 725 may be disposed to the left of the first mat region (MAT1) and the right of the second mat region (MAT2), and to the left of the third mat region (MAT3) and the right of the fourth mat region (MAT4).

In this case, in a write operation of the first mat region (MAT1) or the second mat region (MAT2), the first plugs 720 disposed between the first mat region (MAT1) and the second mat region (MAT2) may be used as current paths. On the other hand, in a read operation of the first mat region (MAT1), the second plugs 725 disposed to the left of the first mat region (MAT1) may be used as current paths, and in a read operation of the second mat region (MAT2), the second plugs 725 disposed to the right of the second mat region (MAT2) may be used as current paths. Write and read operations for the third and fourth mat regions (MAT3 and MAT4) may be performed in a similar manner to the write and read operations for the first and second mat regions (MAT1 and MAT2).

In another implementation, the position of the first plugs 720 and the position of the second plugs 725 may be reversed. In other words, the second plugs 725 may be located between two adjacent mat regions, and the first plugs 720 may be located at both sides of the two adjacent mat regions.

In a process of fabricating the semiconductor device shown in FIG. 7, a mask pattern having an opening O that exposes a region in which the first plug 720 is formed is used (see FIG. 4D). The opening O may have a line shape that has a width larger than that of the first plug 720 in the first direction and that extends in the second direction.

According to the implementations of the disclosed technology described above, there may be provided an electronic device including a semiconductor device having improved operating characteristics and reliability, and a method for fabricating the same.

The above and other memory circuits or semiconductor devices based on the disclosed technology can be used in a range of devices or systems. FIGS. 8-12 provide some examples of devices or systems that can implement the memory circuits disclosed herein.

Figure 8:
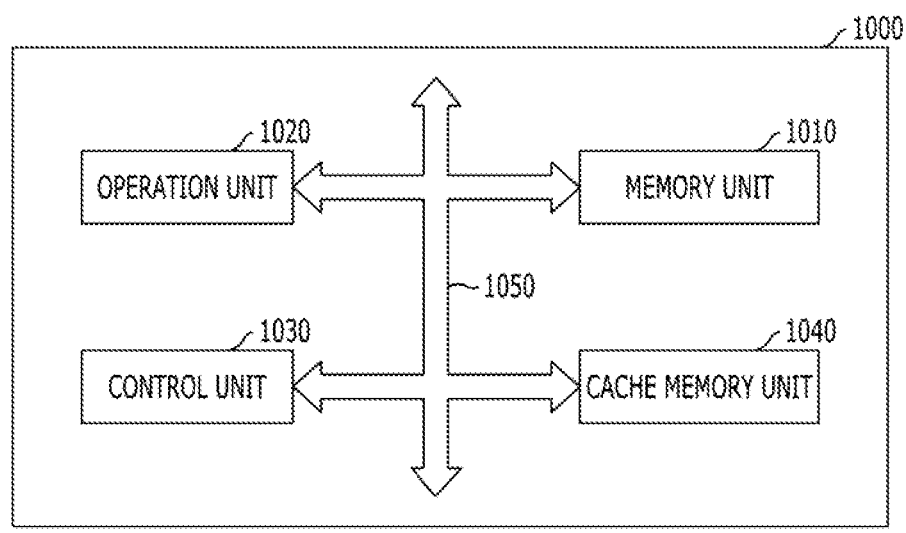
FIG. 8 is an example of configuration diagram of a microprocessor implementing memory circuitry based on the disclosed technology.

FIG. 8 is an example of configuration diagram of a microprocessor implementing memory circuitry based on the disclosed technology.

Referring to FIG. 8, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a plurality of first lines extending in a first direction; a plurality of second lines extending in a second direction that intersects with the first direction; a plurality of variable resistance elements disposed between the first lines and the second lines and located at intersections of the first lines and the second lines; and a plug connected to a first portion of each of the first lines, wherein the plug comprises a conductive layer and a material layer having a resistance value higher than that of the conductive layer. Through this, operating characteristics and reliability of the memory unit 1010 may be improved. As a consequence, operating characteristics and reliability of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 9:
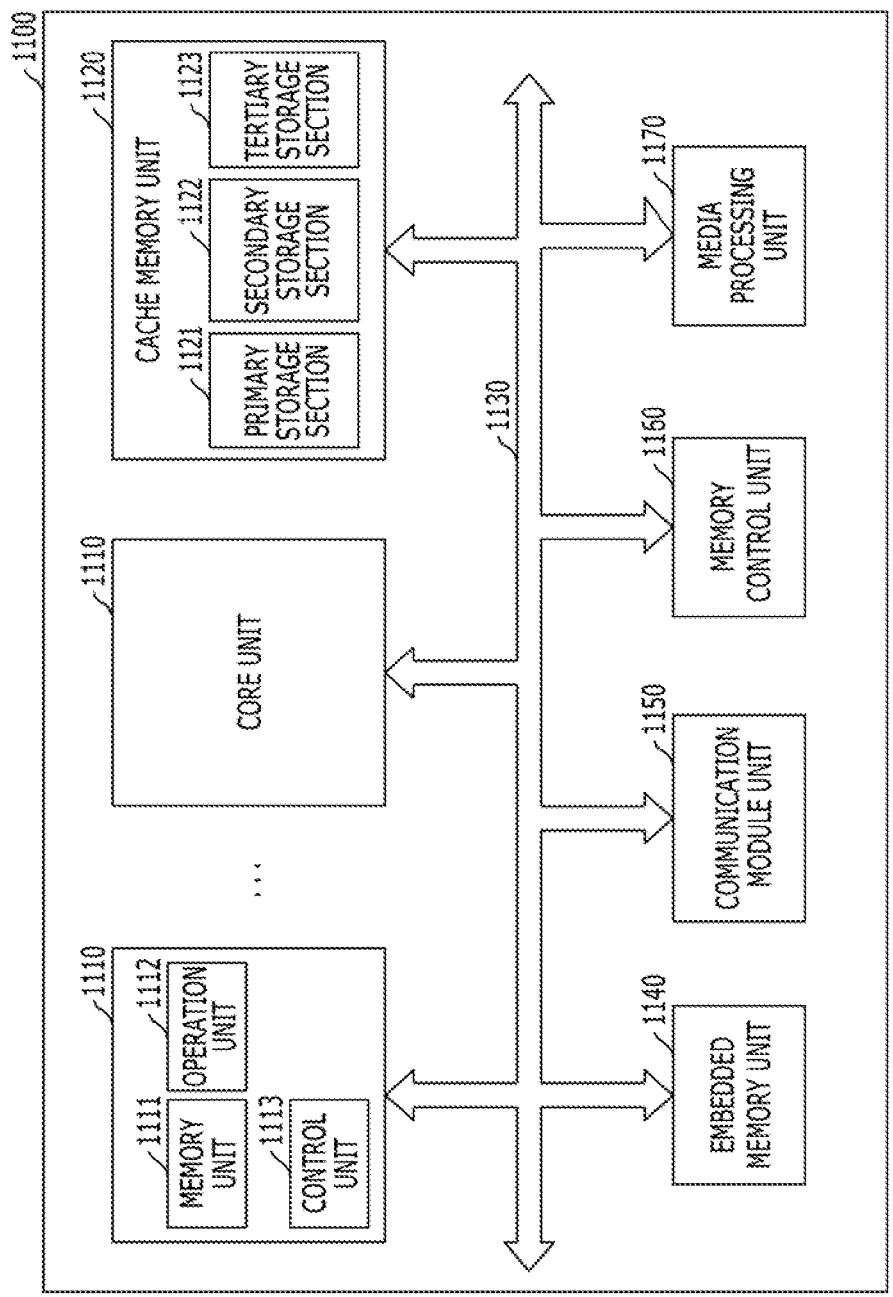
FIG. 9 is an example of configuration diagram of a processor implementing memory circuitry based on the disclosed technology.

FIG. 9 is an example of configuration diagram of a processor implementing memory circuitry based on the disclosed technology.

Referring to FIG. 9, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a plurality of first lines extending in a first direction; a plurality of second lines extending in a second direction that intersects with the first direction; a plurality of variable resistance elements disposed between the first lines and the second lines and located at intersections of the first lines and the second lines; and a plug connected to a first portion of each of the first lines, wherein the plug comprises a conductive layer and a material layer having a resistance value higher than that of the conductive layer. Through this, operating characteristics and reliability of the cache memory unit 1120 may be improved. As a consequence, operating characteristics and reliability of the processor 1100 may be improved.

Although it was shown in FIG. 9 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 10:
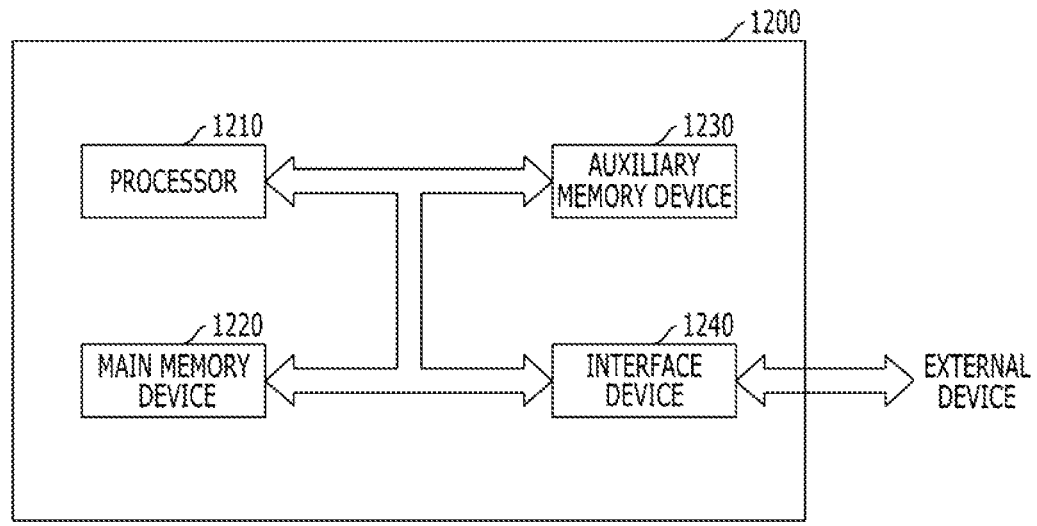
FIG. 10 is an example of configuration diagram of a system implementing memory circuitry based on the disclosed technology.

FIG. 10 is an example of configuration diagram of a system implementing memory circuitry based on the disclosed technology.

Referring to FIG. 10, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a plurality of first lines extending in a first direction; a plurality of second lines extending in a second direction that intersects with the first direction; a plurality of variable resistance elements disposed between the first lines and the second lines and located at intersections of the first lines and the second lines; and a plug connected to a first portion of each of the first lines, wherein the plug comprises a conductive layer and a material layer having a resistance value higher than that of the conductive layer. Through this, operating characteristics and reliability of the main memory device 1220 may be improved. As a consequence, operating characteristics and reliability of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a plurality of first lines extending in a first direction; a plurality of second lines extending in a second direction that intersects with the first direction; a plurality of variable resistance elements disposed between the first lines and the second lines and located at intersections of the first lines and the second lines; and a plug connected to a first portion of each of the first lines, wherein the plug comprises a conductive layer and a material layer having a resistance value higher than that of the conductive layer. Through this, operating characteristics and reliability of the auxiliary memory device 1230 may be improved. As a consequence, operating characteristics and reliability of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 11:
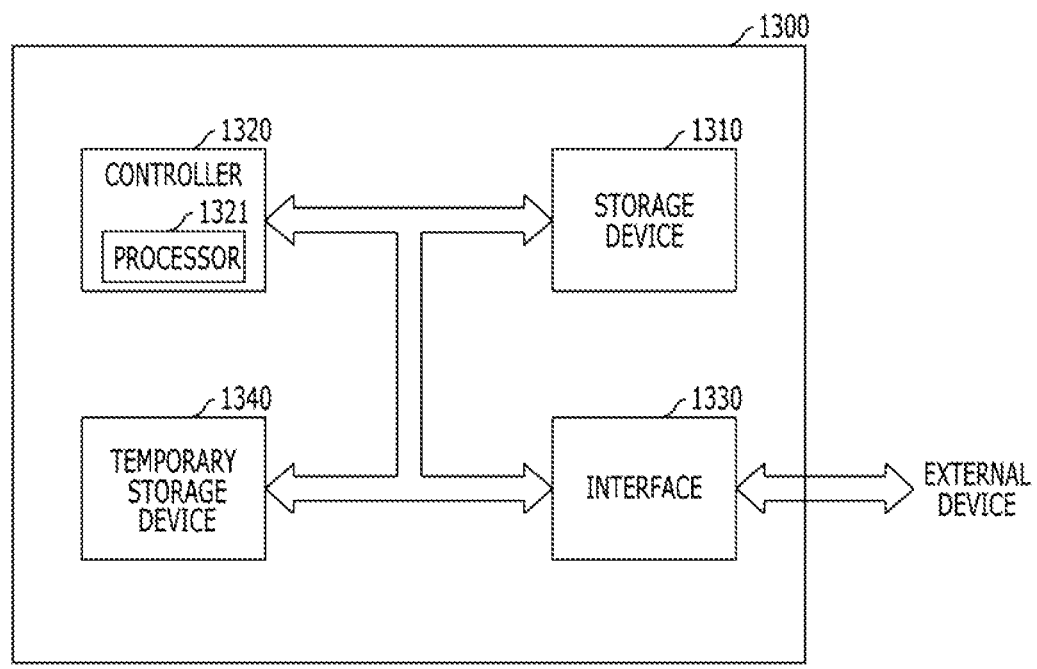
FIG. 11 is an example of configuration diagram of a data storage system implementing memory circuitry based on the disclosed technology.

FIG. 11 is an example of configuration diagram of a data storage system implementing memory circuitry based on the disclosed technology.

Referring to FIG. 11, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a plurality of first lines extending in a first direction; a plurality of second lines extending in a second direction that intersects with the first direction; a plurality of variable resistance elements disposed between the first lines and the second lines and located at intersections of the first lines and the second lines; and a plug connected to a first portion of each of the first lines, wherein the plug comprises a conductive layer and a material layer having a resistance value higher than that of the conductive layer. Through this, operating characteristics and reliability of the storage device 1310 or the temporary storage device 1340 may be improved. As a consequence, operating characteristics, reliability and data storage characteristics of the data storage system 1300 may be improved.

Figure 12:
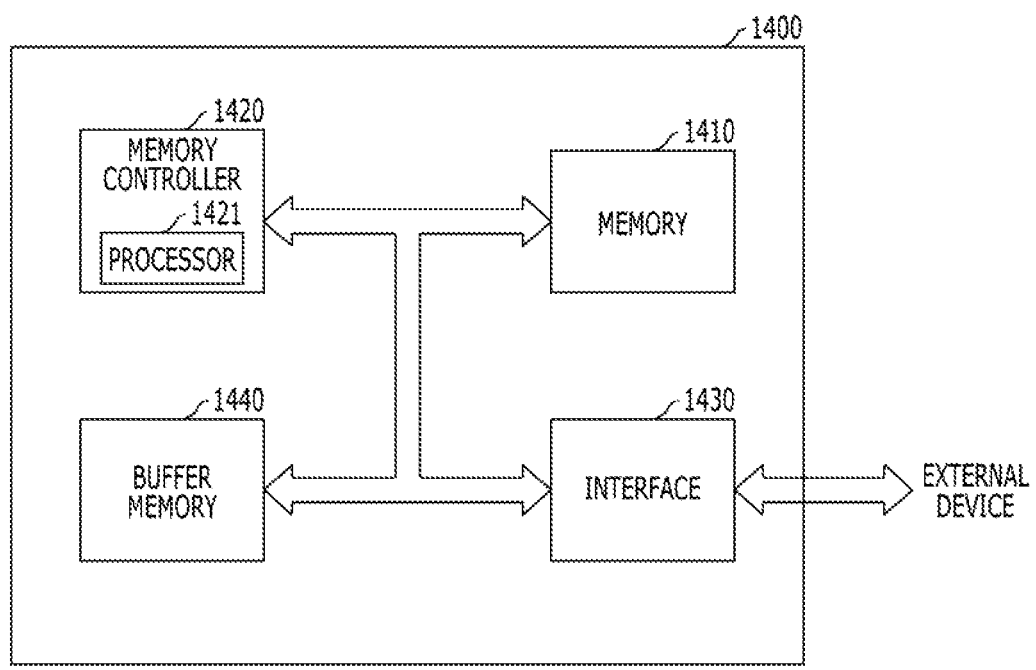
FIG. 12 is an example of configuration diagram of a memory system implementing memory circuitry based on the disclosed technology.

FIG. 12 is an example of configuration diagram of a memory system implementing memory circuitry based on the disclosed technology.

Referring to FIG. 12, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a plurality of first lines extending in a first direction; a plurality of second lines extending in a second direction that intersects with the first direction; a plurality of variable resistance elements disposed between the first lines and the second lines and located at intersections of the first lines and the second lines; and a plug connected to a first portion of each of the first lines, wherein the plug comprises a conductive layer and a material layer having a resistance value higher than that of the conductive layer. Through this, operating characteristics and reliability of the memory 1410 may be improved. As a consequence, operating characteristics, reliability and memory characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a plurality of first lines extending in a first direction; a plurality of second lines extending in a second direction that intersects with the first direction; a plurality of variable resistance elements disposed between the first lines and the second lines and located at intersections of the first lines and the second lines; and a plug connected to a first portion of each of the first lines, wherein the plug comprises a conductive layer and a material layer having a resistance value higher than that of the conductive layer. Through this, operating characteristics and reliability of the buffer memory 1440 may be improved. As a consequence, operating characteristics, reliability and memory characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 8-12 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises:
    a plurality of first lines extending in a first horizontal direction;
    a plurality of second lines extending in a second horizontal direction perpendicular to the first horizontal direction;
    a plurality of variable resistance elements disposed between the first lines and the second lines;
    a first plug connected to a first portion of each of the first lines, wherein each of the variable resistance elements is coupled to the first plug via the first portion of each of the first lines as a current path in a write operation; and
    a second plug connected to a second portion of each of the first lines, wherein each of the variable resistance elements is coupled to the second plug via the second portion of each of the first lines as a current path in a read operation,
    wherein the first plug and the second plug are directly connected to a same one of the variable resistance elements via each of the first lines,
    wherein the first plug and the second plug are spaced apart from the variable resistance elements in a vertical direction and are disposed in parallel to each other, the vertical direction being perpendicular to the first and second horizontal directions,
    wherein the first lines is disposed between the variable resistance elements and the first plug in the vertical direction,
    wherein the first plug comprises a first conductive layer and a material layer stacked in the vertical direction,
    wherein the second plug comprises a conductive layer, and
    wherein the material layer has a resistance value higher than that of the first conductive layer, the first plug having a resistance value higher than that of the second plug.

2. The electronic device of claim 1,
    wherein the first plug and the second plug are disposed in the first direction with the plurality of variable resistance elements disposed therebetween.

3. The electronic device of claim 1,
    wherein the first plug and the second plug are disposed opposite to the variable resistance elements across the first lines, and have a same length in the vertical direction.

4. The electronic device of claim 1, wherein a sidewall of the first conductive layer of the first plug is aligned with a sidewall of the material layer of the first plug.

5. The electronic device of claim 1, wherein the first plug further comprises a second conductive layer,
    wherein the material layer is disposed between the first conductive layer and the second conductive layer.

6. The electronic device of claim 1, wherein the second plug does not comprise the material layer.

7. The electronic device of claim 1, further comprising:
    a first interlayer insulating layer surrounds sidewalls of the first plug and the second plug; and
    a second interlayer insulating layer between the first lines and the second lines,
    wherein the second interlayer insulating layer surrounds sidewalls of the variable resistance elements.

8. The electronic device of claim 1, wherein the first conductive layer and the conductive layer comprise a metallic layer, and the material layer comprise one of a semiconductor material and a dielectric layer.

9. The electronic device of claim 1, wherein each of the variable resistance elements comprises a variable resistance layer and a selection element layer which stacked in the vertical direction.

10. The electronic device of claim 1, wherein the material layer has a smaller thickness than the first conductive layer.

11. An electronic device comprising a semiconductor memory, wherein the semiconductor memory comprises:
    a first interlayer insulating layer;
    a first line above the first interlayer insulating layer, the first line being extending in a first direction;
    a second line extending in a second direction perpendicular to the first direction;
    a variable resistance element disposed between the first line and the second line;
    a first plug passing through the first interlayer insulating layer and being connected to a first portion of the first line in a third direction, the third direction being perpendicular to the first direction and the second direction; and
    a second plug passing through the first interlayer insulating layer to be connected to a second portion of the first line in the third direction,
    wherein the first line is disposed between the variable resistance element and the first plug in the third direction,
    wherein the first plug comprises a first conductive layer and a material layer that are stacked in the third direction,
    wherein the first interlayer insulating layer surrounds sidewalls of the first conductive layer and the material layer,
    wherein the variable resistance element is coupled to the first plug via the first portion of the first line as a current path in a write operation, the variable resistance element is coupled to the second plug via the second portion of the first line as a current path in a read operation, and the first plug and the second plug are directly connected to the variable resistance element via the first line, and
    wherein the first plug has a resistance value higher than that of the second plug.

12. The electronic device of claim 11, wherein the second plug comprises a metallic layer.

13. The electronic device of claim 12, wherein the second plug does not comprise a dielectric layer or a semiconductor layer.

14. The electronic device of claim 11,
    wherein the first plug further comprises a second conductive layer, and wherein the material layer is disposed between the first conductive layer and the second conductive layer.

15. The electronic device of claim 14, wherein the first and second conductive layer comprise a metallic layer, and the material layer comprises one of a semiconductor layer and a dielectric layer.

16. The electronic device according to claim 11, further comprising a microprocessor which includes:
   a control unit configured to receive a signal including a command from an outside of the microprocessor, and performs extracting, decoding of the command, or controlling input or output of a signal of the microprocessor;
   an operation unit configured to perform an operation based on a result that the control unit decodes the command; and
   a memory unit configured to store data for performing the operation, data corresponding to a result of performing the operation, or an address of data for which the operation is performed,
   wherein the semiconductor memory is part of the memory unit in the microprocessor.

17. The electronic device according to claim 11, further comprising a processor which includes:
   a core unit configured to perform, based on a command inputted from an outside of the processor, an operation corresponding to the command, by using data;
   a cache memory unit configured to store data for performing the operation, data corresponding to a result of performing the operation, or an address of data for which the operation is performed; and
   a bus interface connected between the core unit and the cache memory unit, and configured to transmit data between the core unit and the cache memory unit,
   wherein the semiconductor memory is part of the cache memory unit in the processor.

18. The electronic device according to claim 11, further comprising a processing system which includes:
   a processor configured to decode a command received by the processor and control an operation for information based on a result of decoding the command;
   an auxiliary memory device configured to store a program for decoding the command and the information;
   a main memory device configured to call and store the program and the information from the auxiliary memory device such that the processor can perform the operation using the program and the information when executing the program; and
   an interface device configured to perform communication between at least one of the processor, the auxiliary memory device and the main memory device and an outside,
   wherein the semiconductor memory is part of the auxiliary memory device or the main memory device in the processing system.

19. The electronic device according to claim 11, further comprising a data storage system which includes:
   a storage device configured to store data and conserve stored data regardless of power supply;
   a controller configured to control input and output of data to and from the storage device according to a command inputted form an outside;
   a temporary storage device configured to temporarily store data exchanged between the storage device and the outside; and
   an interface configured to perform communication between at least one of the storage device, the controller and the temporary storage device and the outside,
   wherein the semiconductor memory is part of the storage device or the temporary storage device in the data storage system.

20. The electronic device according to claim 11, further comprising a memory system which includes:
   a memory configured to store data and conserve stored data regardless of power supply;
   a memory controller configured to control input and output of data to and from the memory according to a command inputted form an outside;
   a buffer memory configured to buffer data exchanged between the memory and the outside; and
   an interface configured to perform communication between at least one of the memory, the memory controller and the buffer memory and the outside,
   wherein the semiconductor memory is part of the memory or the buffer memory in the memory system.

21. An electronic device comprising a semiconductor memory, wherein the semiconductor memory comprises:
   a plurality of first lines extending in a first horizontal direction;
   a plurality of second lines extending in a second horizontal direction perpendicular to the first horizontal direction;
   a plurality of variable resistance elements disposed between the first lines and the second lines;
   a first plug connected to a first portion of each of the first lines, wherein each of the variable resistance elements is coupled to the first plug via the first portion of each of the first lines as a current path in a write operation; and
   a second plug connected to a second portion of each of the first lines, wherein each of the variable resistance elements is coupled to the second plug via the second portion of each of the first lines as a current path in a read operation,
   wherein the first plug and the second plug are directly connected to a same one of the variable resistance elements via each of the first lines, and
   wherein the first plug has a resistance value higher than that of the second plug.

22. An electronic device comprising a semiconductor memory, wherein the semiconductor memory comprises:
   a plurality of first lines extending in a first horizontal direction;
   a plurality of second lines extending in a second horizontal direction perpendicular to the first horizontal direction;
   a plurality of variable resistance elements disposed between the first lines and the second lines;
   a first plug connected to a first portion of each of the first lines; and
   a second plug connected to a second portion of each of the first lines,
   wherein the first plug comprises a first conductive layer, a material layer, and a second conductive layer that are sequentially stacked in a vertical direction that is perpendicular to the first and second horizontal directions
   wherein each of the variable resistance elements is coupled to the first plug via the first portion of each of the first lines as a current path in a write operation;

wherein each of the variable resistance elements is coupled to the second plug via the second portion of each of the first lines as a current path in a read operation, wherein the first plug and the second plug are directly connected to a same one of the variable resistance elements via each of the first lines, and wherein the first plug has a resistance value higher than that of the second plug.

\* \* \* \* \*